(12) United States Patent
Xiang

(10) Patent No.: US 11,156,662 B2
(45) Date of Patent: Oct. 26, 2021

(54) SOFTWARE DEFINED LFSR FOR LOC DELAY TESTING LOW-POWER TEST COMPRESSION

(71) Applicant: Tsinghua University, Beijing (CN)

(72) Inventor: Dong Xiang, Beijing (CN)

(73) Assignee: TSINGHUA UNIVERSITY

( * ) Notice: Subject to any disclaimer, the term of this patent is extended or adjusted under 35 U.S.C. 154(b) by 60 days.

(21) Appl. No.: 16/351,386

(22) Filed: Mar. 12, 2019

(65) Prior Publication Data

US 2019/0339328 A1    Nov. 7, 2019

(30) Foreign Application Priority Data

May 2, 2018   (CN) .......................... 201810410937.4

(51) Int. Cl.
| | | |
|---|---|---|
| *G01R 31/28* | (2006.01) | |
| *G06F 11/00* | (2006.01) | |
| *G01R 31/3183* | (2006.01) | |
| *G01R 31/3181* | (2006.01) | |
| *G01R 31/3185* | (2006.01) | |
| *G01R 31/3187* | (2006.01) | |

(52) U.S. Cl.
CPC . *G01R 31/318328* (2013.01); *G01R 31/3187* (2013.01); *G01R 31/31813* (2013.01); *G01R 31/318335* (2013.01); *G01R 31/318385* (2013.01); *G01R 31/318547* (2013.01)

(58) Field of Classification Search
None
See application file for complete search history.

(56) References Cited

U.S. PATENT DOCUMENTS

| 6,567,017 | B2 | 5/2003 | Medlock | |
|---|---|---|---|---|
| 2005/0055617 | A1* | 3/2005 | Wang | G01R 31/318547 |
| | | | | 714/727 |
| 2005/0138509 | A1* | 6/2005 | Kiryu | G01R 31/318566 |
| | | | | 714/726 |

FOREIGN PATENT DOCUMENTS

| CN | 101894591 A | 11/2010 |
|---|---|---|
| CN | 101933098 A | 12/2010 |
| CN | 103499787 A | 1/2014 |
| CN | 104681091 A | 6/2015 |
| CN | 107526019 A | 12/2017 |
| CN | 107544017 A | 1/2018 |

* cited by examiner

*Primary Examiner* — Guerrier Merant
(74) *Attorney, Agent, or Firm* — Morriss O'Bryant Compagni Cannon, PLLC

(57) ABSTRACT

A software-defined linear feedback shift register (SLFSR) implements a low-power test compression for launch-on-capture (LOC). Each bit of an extra register controls a stage of the SLFSR. A control vector is shifted into the extra register to indicate whether a primitive polynomial contains the stage of the non-zero bit. Therefore, SLFSR can configure any primitive polynomials with different degrees by loading different control vectors without any hardware overhead. A low-power test compression method and design for testability (DFT) architecture provide LOC transition fault testing by using seed encoding scheme, low-power test application procedure and a software-defined linear-feedback shift-register (SLFSR) architecture. The seed encoding scheme generates seeds for all test pairs by selecting a primitive polynomial that encodes all test pairs of a compact test set.

4 Claims, 6 Drawing Sheets

SOFTWARE DEFINED LFSR FOR LOC DELAY TESTING LOW-POWER TEST COMPRESSION

CROSS-REFERENCE TO RELATED APPLICATION

This application claims priority to Chinese Patent Application No. 201810410937.4 filed May 2, 2018, the entirety of which is incorporated by this reference.

FIELD OF TECHNOLOGY

The present disclosure relates to test technique of the integrated circuit and more particularly to the design for testability architecture to implement low power test compression for LOC delay testing.

BACKGROUND

TABLE 1

ATPG results for single stuck-at faults and LOC delay testing

| circuits | details of the circuits | | | | stuck-at tests | | | | transition test | | | |
| --- | --- | --- | --- | --- | --- | --- | --- | --- | --- | --- | --- | --- |
| | PIs | POs | FFs | gates | vec | FC | MAX | CPU(s) | vec | FC | MAX | CPU(s) |
| b19 | 24 | 30 | 6,642 | 225,800 | 1546 | 98.80 | 3659 | 3560 | 9652 | 84.47 | 4053 | 11246 |
| ethernet | 94 | 115 | 13,715 | 105,371 | 906 | 99.20 | 1931 | 1480 | 3501 | 99.39 | 2159 | 7616 |
| vga_lcd | 87 | 109 | 17,079 | 153,664 | 980 | 99.40 | 5884 | 2940 | 9045 | 99.64 | 6032 | 14110 |
| netcard | 15 | 646 | 97,796 | 568,986 | 2260 | 99.10 | 7371 | 4680 | 27810 | 97.52 | 9609 | 35220 |

Test data volume for LOC transition fault testing is far more than that of single stuck-at testing. Table I presents test generation results for LOC transition fault testing and single stuck-at fault testing. The columns with vec, FC and MAX represent the number of tests, fault coverage, and the number of maximum care bits for the whole test set, respectively. It is found that the number of test vectors for LOC transition fault testing is far more. The maximum number of care bits for single stuck-at tests is also apparently less than that for LOC transition fault testing. It is important for us to present an effective method for LOC transition fault test compression. Scan chain designs are used for both single stuck-at fault testing and LOC transition fault testing.

The current commercial EDA tools cannot handle test compression for LOC delay testing well. Excessive test power dissipation of test power has been a severe problem, which is even more difficult to handle for LOC delay testing. The huge amount of test data for delay testing makes test compression for delay testing even more important than that for stuck-at fault testing. Test application of compressed test data produces further more test power. Therefore, there is a strong need for an effective low-power test compression approach.

In this disclosure, a low-power test compression architecture for LOC-based transition fault testing is proposed. The major contributions of this disclosure are as follows: (1) the technique to select the primitive LFSR established by the selected primitive polynomial and the selected number of additional variables injected to the LFSR; (2) the scan tree architecture for LOC transition fault testing; and (3) the gating technique. (4) A static test compaction scheme is proposed by bitwise modifying the values of a seed and the additional variables.

Most of the previous deterministic BIST approaches did not include low-power concerns. It is intended to present a method that effectively combines an efficient low-power test application scheme for LOC delay testing. Power consumption for delay testing is an even more difficult problem because of a much larger number of delay test patterns. It is proposed a low-power test compression approach for LOC transition fault testing by using a DFT architecture, test application scheme, seed modification and test point insertion technique.

As for the DFT architecture, the method introduces a primitive polynomial selection method, and a scheme to select the number of additional variables. Using the proposed DFT architecture, all deterministic test pairs can be encoded into a seed with a sequence of additional variables injected into the LFSR.

In order to further reduce test data volume, it is proposed a seed modification technique. The seed modification technique can remove some seeds by revising the calculated values of the additional variables and the seed for each test pair. The seed modification technique is implemented by complementing value of each bit for the seed and additional variables, which removes some seeds and reduces test data volume without any additional control data. The key point is to reduce CPU to implement the test modification scheme.

SUMMARY

The Design for Testability Architecture

A design for testability (DFT) architecture is presented in FIG. 1 to implement the low-power test compression method for LOC transition fault testing using a deterministic built-in self-test (BIST) scheme and the software-defined linear feedback shift register (SLFSR).

The DFT architecture includes: (1) the SLFSR established by the selected primitive polynomial and the selected number of additional variables injected to the SLFSR, and the extra register with the loaded control vector for primitive polynomial configuration; (2) the scan tree architecture for LOC transition fault testing; and (3) the gating technique.

The disclosure inserts all DFT logics before automatic test pattern generation (ATPG), the DFT logics include the SLFSR, the phase shifter (PS), the demultiplexers, gating logic, and the scan forest for LOC transition fault testing, the XOR network for test response compaction, and the unknown-tolerant MISR.

The disclosure selects a primitive polynomial with the minimum degree and the smallest number of additional variables, which encodes all deterministic tests. The scan trees are constructed by circuit structural analysis. Each output of a demultiplexer drives a scan tree, where all scan flip-flops at the same level of a scan tree do not have any common combinational successor in the two-frame circuit.

More scan chains are connected to the same XOR to compact test responses if the scan flip-flops at the same level of the scan chains do not have any common predecessor in the two-frame circuit.

Each demultiplexer drives the same number of scan trees, where each scan tree is driven by a separate clock signal. The signal $R'_1$ drives all the first scan trees from all demultiplexers, the signal $R'_2$ drives all the second scan trees from all demultiplexers, . . . , and $R'_k$ drives all the kth scan trees from all demultiplexers. Increasing the fanout factor of the demultiplexers does not increase test application cost because the depth of the scan trees decreases.

Each stage of the PS drives multiple scan trees as shown in FIG. 1, which can also significantly reduce the size of the PS compared with the multiple scan-chain architecture. Each stage of the PS in multiple scan-chain design drives a single scan chain. If the fanout factor of the demultiplexers is 16, and the group size for the scan trees is 10. Each scan-in pin drives 160 scan chains. The compactor connected to the combinational part CUT of the circuit is to reduce the size of the MISR.

Low-Power Test Compression

The flowchart of the low-power test compression scheme for LOC transition fault testing is presented in FIG. 2:
a. Insert the low-power scan architecture, the decompressor/compactor, and SLFSR into the circuit, (2) conduct compact ATPG to generate LOC at—speed scan tests for transition delay faults, (3) select a primitive polynomial to encode all generated tests, (4) load the control vector to implement SLFSR, (5) apply the generated seeds in the low-power test application mode, while each with a sequence of additional variables.

First, the SLFSR, phase shifter, scan forest for LOC transition fault testing, the gating logic, and the unknown-tolerant test response compactor are inserted into the circuit. After all DFT logics have been inserted, the method runs the ATPG tool to generate the compact test set for all transition faults. The disclosure selects the primitive polynomial with minimum degrees and the smallest number of additional variables injected into the SLFSR, which encodes all test pairs. The method produces the control vector and loads it into the extra register to establish the SLFSR with the selected primitive polynomial. Each test seed, with the injected additional variables, is applied to the circuit in the low-power test mode. Continue the above process until all test seeds have been applied.

The Software-Defined Linear Feedback Shift Register

The software-defined linear feedback shift-register (SLFSR) is designed as a configurable n stage LFSR. It can be configured to any LFSR with no more than n stages, which connected by any primitive polynomial with no more than n degree.

The SLFSR as shown in FIG. 3 consists of n D flip-flops, an extra n-bit register, and each of the D flip-flops is connected to the 2-input multiplexer whose another input is constant 0. The selection signal of the 2-input multiplexer is connected to the corresponding bit of the extra register. The output of the multiplexer selects the output of the corresponding D flip-flop when the selection signal is set to value 1; otherwise, it selects constant 0.

According to the selected primitive polynomial, generate the control vector for the SLFSR. That is, determine each bit of the control vector as follows: set the bit to value 1 if the stage in the selected primitive polynomial is non-zero, otherwise, it is set to 0. Load the control vector to the extra register of the SLFSR.

The simplified version (in FIG. 4) of the software defined linear feedback shift register (SLFSR) is presented as follows: each multiplexer is replaced by a 2-input AND gate, one input is connected to the output of the corresponding D flip-flop, the other input is directly connected the corresponding bit of the extra register.

The control vector, loaded into the extra register, defines the primitive to establish the selected LFSR. Determine each bit of the control vector as follows: set the bit to value 1 if the stage in the selected primitive polynomial is non-zero, otherwise, it is set to 0.

The software-defined linear feedback shift register as stated can be replaced by the following alternative SLFSR architecture as shown in FIG. 5: each 2-input AND gate is replaced by a 2-input NOR gate, the output of each D flip-flop is connected to an inverter, and the output of the inverter is connected to the 2-input NOR gate. The other input of the 2-input NOR gate is connected the corresponding bit of the extra register. The control vector is determined as follows: set the bit to value 0 if the stage in the selected primitive polynomial is non-zero, otherwise, it is set to 1.

The SLFSR as stated can also be applied to ring generator or folded counter for test data compression. The SLFSR can also be applied to test compression for single stuck-at tests; only the scan forest and the test response compactor are revised according to the single frame circuit.

Static Test Compaction by Bitwise Modifying the Tests

A static test compaction procedure, after all tests have been produced, is proposed by bitwise modifying the care bits of the pattern. The test patterns are ordered according to the number of care bits. It is considered the compact test set for LOC transition fault testing after dynamic and static test compaction have been completed. Each test pair t keeps a fault list Ft covered by the test pair.

A pattern with the most care bits is taken first, the method performs fault simulation on the modified seed on each bit of the seed and the additional variables by complementing the bit. Fault simulation is performed on a small subset of faults to reduce CPU time fault simulation. The subset of faults contains only faults on the influenced region by the changed bit of the test pair.

The method uses a selective tracing scheme to find the influenced region of the change bit from the changed bit on the test pair on the two-frame circuit model. The process continues until a gate with any other input I assigned a controlling value or the output of the gate is don't care, where I is not in the influenced region of the change bit.

The method remains the modification on the test t if the modified test covers all detected faults in Ft, and detects at least one more fault covered by any test later in the ordered test sequence. Otherwise, the method recovers the test back to the original. When complementing a bit of the test makes the test pair detect any fault f covered by another test pair t' later in the ordered sequence, the fault f is moved to the detected fault list Ft of test t. This fault is also removed from the detected fault list Ft' of test t'. When the detected fault list Fr of t' becomes empty, t' is deleted from the test set.

BRIEF DESCRIPTION OF THE DRAWINGS

Accompanying drawings illustrated herein are used for providing further understanding of the present disclosure and form a part of the present disclosure. The schematic embodiments of the present disclosure and descriptions thereof are used for explaining the present disclosure rather than improperly limiting the present disclosure. In the accompanying drawings.

DESCRIPTION OF THE EMBODIMENTS

The Flowchart of the Low-Power Test Compression Approach for LOC Delay Testing

Figure 2:
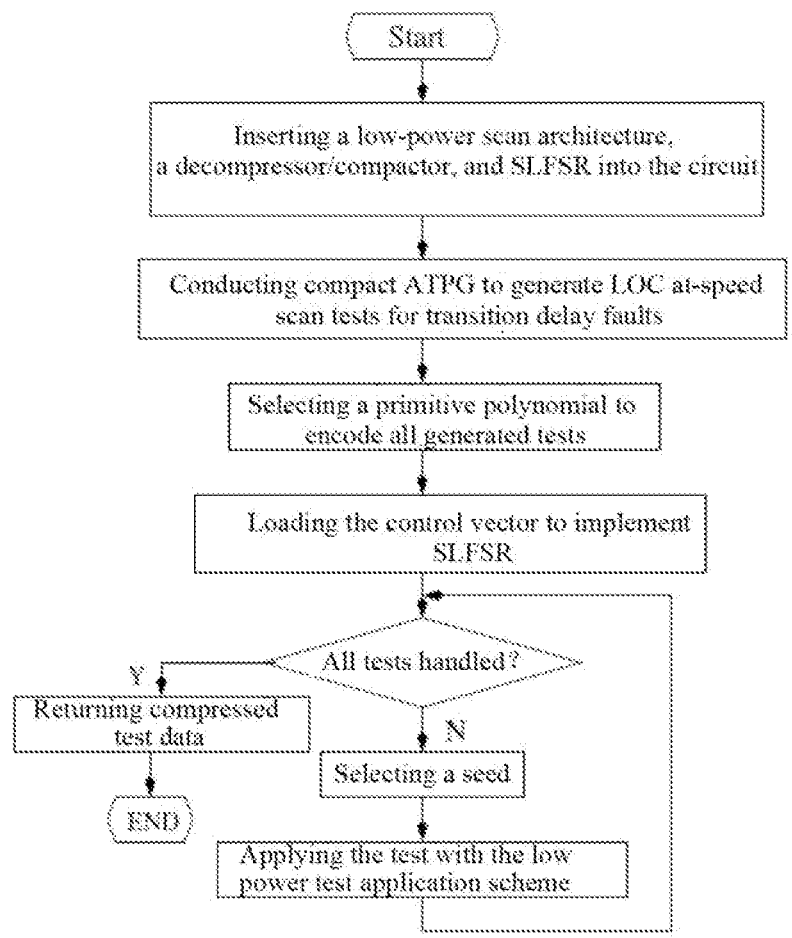
FIG. 2 is a diagram of the flowchart to design for low-power test compression, ATPG, and low-power test application.

The flowchart of the low-power test compression scheme for LOC transition fault testing is presented in FIG. 2:

(1) Insert the low-power scan architecture, the decompressor/compactor, and SLFSR into the circuit, (2) conduct compact ATPG to generate LOC at—speed scan tests for transition delay faults, (3) select a primitive polynomial to encode all generated tests, (4) load the control vector to implement SLFSR, (5) apply the generated seeds in the low-power test application mode, while each with a sequence of additional variables.

First, the SLFSR, phase shifter, scan forest for LOC transition fault testing, the gating logic, and the unknown-tolerant test response compactor are inserted into the circuit. After all DFT logics have been inserted, the method runs the ATPG tool to generate the compact test set for all transition faults. The disclosure selects the primitive polynomial with minimum degrees and the smallest number of additional variables injected into the SLFSR, which encodes all test pairs. The method produces the control vector and loads it into the extra register to establish the SLFSR with the selected primitive polynomial. Each test seed, with the injected additional variables, is applied to the circuit in the low-power test mode. Continue the above process until all test seeds have been applied.

The Design for Testability Architecture to Implement Low-Power Test Compression for LOC Delay Testing Test data volume for LOC transition fault testing is far more than that of single stuck-at testing. Table I presents test generation results for LOC transition fault testing and single stuck-at fault testing. The columns with vec, FC and MAX represent the number of tests, fault coverage, and the number of maximum care bits for the whole test set, respectively. It is found that the number of test vectors for LOC transition fault testing is far more. The maximum number of care bits for single stuck-at tests is also apparently less than that for LOC transition fault testing. It is important for us to present an effective method for LOC transition fault test compression.

Test compression tools or methods for stuck-at tests cannot be directly used to compress test data for LOC delay fault testing because test compression for LOC delay testing is quite different. They are different in the following aspects: (1) stimulus test data for LOC delay testing are generated in the two-frame circuit, while stuck-at tests are generated in the one-frame circuit. Therefore, the correlation between each pair of scan flip-flops is quite different. (2) Test response data compaction should also be different. Response data for any pair of scan flip-flops are also extended to the two-frame circuit; however, test response data of two scan flip-flops for single stuck-at fault testing is considered in the one-frame circuit, that is, the combinational part of the circuit.

There is a sufficient condition to merge two scan flip-flops $f_1$ and $f_2$ into a single for LOC transition fault testing if $f_1$ and $f_2$ do not have any common combinational successor in the two-frame circuit. Two scan flip-flops $f_1$ and $f_2$ can be included into the same scan flip-flop group for single stuck-at fault testing if $f_1$ and $f_2$ do not have any common combinational successor in the combinational part of the circuit.

It can also be provided a sufficient condition for test response compaction and test compression. Test stimulus for two scan flip-flops can be compressed into a single bit for single stuck-at tests if they do not have any common combinational successor in the two-frame circuit. Test responses for two scan flip-flops can be compacted into a single bit for single stuck-at tests if they do not have any common combinational predecessor in the combinational part of the circuit.

Test stimulus for two scan flip-flops can be compressed into a single bit for LOC transition fault tests if they do not have any common combinational successor in the two-frame circuit. The scan trees are constructed by circuit structural analysis. Each output of a demultiplexer drives a scan tree, where all scan flip-flops at the same level of a scan tree do not have any common combinational successor in the two-frame circuit.

Test responses for two scan flip-flops can be compacted into a single bit for LOC transition fault tests if they do not have any common combinational predecessor in the two-frame circuit. More scan chains are connected to the same XOR to compact test responses if the scan flip-flops at the same level of the scan chains do not have any common predecessor in the two-frame circuit.

As stated above, both test compression and test compaction for single stuck-at tests and LOC transition fault tests are quite different. Therefore, it should be used with different scan architectures and test response compactors. A DFT architecture is presented in FIG. 1 to implement the low-power test compression method for LOC transition fault testing using a deterministic built-in self-test scheme.

Figure 1:
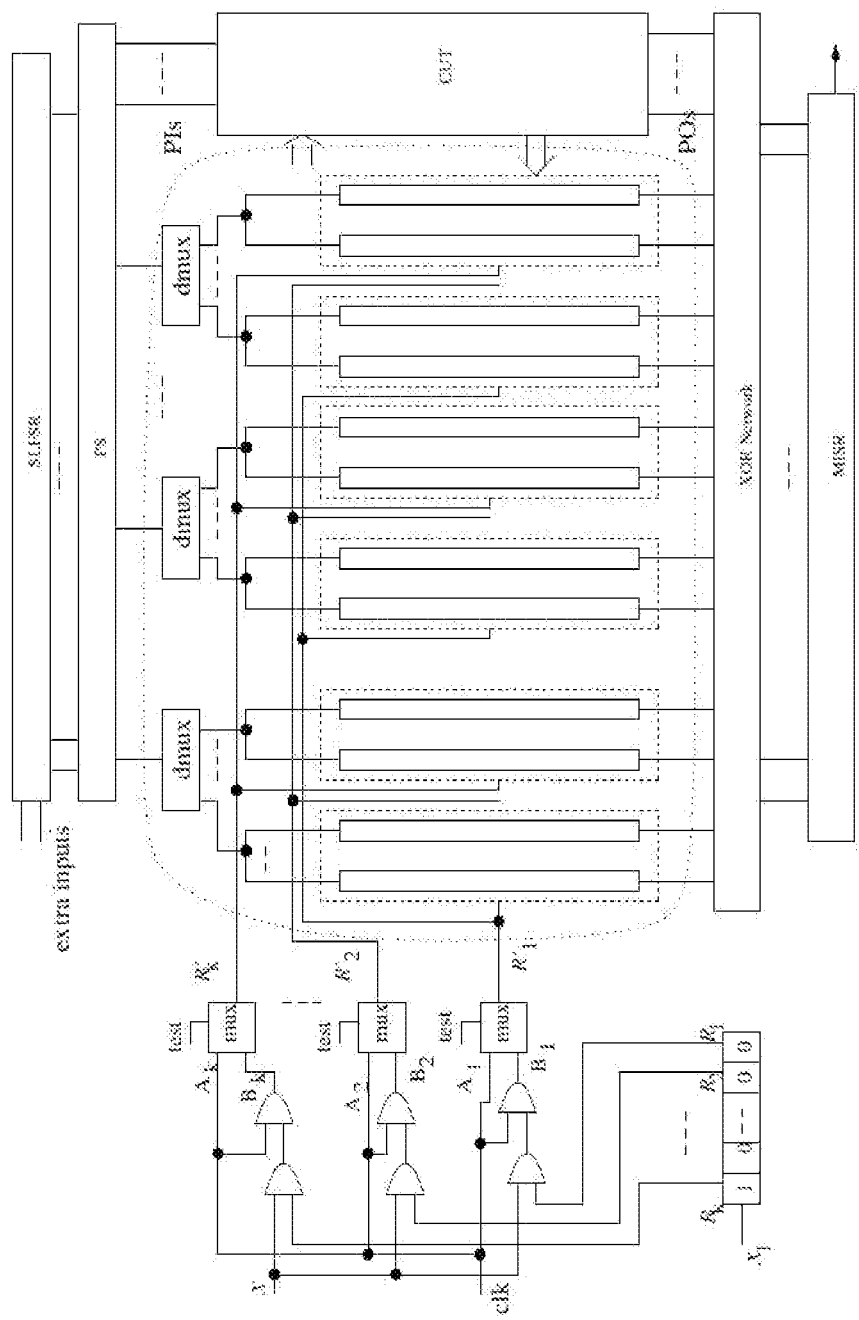
FIG. 1 is a diagram of the general DFT architecture of low-power test compression for LOC transition fault testing.

Each stage of the PS drives multiple scan trees as shown in FIG. 1, which can also significantly reduce the size of the PS compared with the multiple scan-chain architecture. Each stage of the PS in multiple scan-chain design drives a single scan chain. If the fanout factor of the demultiplexers is 16, and the group size for the scan trees is 10. Each scan-in pin drives 160 scan chains. This can also effectively improve the efficiency of test response compaction. The compactor connected to the combinational part CUT of the circuit is to reduce the size of the MISR.

The size of the LFSR can be very large if it is set according to the number of maximum care bits because a few vectors can have a large number of care bits. This may significantly increase the test data volume in order to keep the seeds with big numbers of care bits. The disclosure uses a flexible scheme by injecting additional variables into the SLFSR to reduce the size of the seeds.

There is still enough room to reduce the total number of care bits of all test pairs generated for the scan-chain based designs. Scan tree architecture can significantly reduce the total number of care bits and the maximum number of care bits of the test pairs. It is found that the maximum number of care bits can be reduced tens of times for single stuck-at tests using the scan-tree architecture compared to the previous method.

The size of the LFSR can be determined as follows. A primitive polynomial, with a number of additional variables, is selected. The LFSR established by the selected primitive polynomial and injected additional variables can encode all deterministic test pairs based on a compact test generator. Test sets generated by any other test generators can also be used based on the proposed seed encoding scheme.

A small number of extra pins are required to control the demultiplexers (DMUX) as shown in FIG. 1 in order to implement the gating technique for low-power BIST, where all DMUXs in FIG. 1 can share the same extra pins. The extra pins of all demultiplexers can be connected to an extra register to reduce the pin overhead. As shown in FIG. 1, all scan chains in the same scan tree are selected into the same subset of scan chains, which are driven by the same clock signal.

It is first proposed a scheme to select a proper primitive polynomial with the injected additional variables for the LFSR that encodes all deterministic test pairs. The area overhead can be trivial because the size of the PS can also be very small, where each stage of the PS drives a couple of scan trees based on the proposed gating technique, instead of a single scan chain.

Some additional variables are injected just like EDT. It is proposed a procedure to select the size of the LFSR, the primitive polynomial that establishes the LFSR and the number of additional variables simultaneously in order to minimize the amount of deterministic test data.

The selected primitive polynomial establishes an LFSR that encodes all deterministic test pairs with the selected number of additional variables. The tool that used to generate primitive polynomials can only handle polynomials up to degree 128 of the word-length limit of the computer. However, only very small LFSRs are used for all circuits according to all experimental results (no more than 30). This is mainly because it is injected some additional variables to the LFSR. To encode the deterministic test pairs with a large number of care bits, the injected additional variables and the seed kept in the LFSR are combined.

Some deterministic test patterns cannot be encoded by the established LFSR although the situation does not occur for the circuits that is used up to now. A procedure is proposed to select a primitive polynomial with the minimum degree that can encode all deterministic test pairs for LOC delay testing. Usually, the numbers of care bits of all deterministic test pairs are quite different. The procedure selects a primitive polynomial of relatively low degree according to the low-power test application scheme when some additional variables are injected into the LFSR.

This disclosure selects a primitive polynomial whose degree is no less than 20. The LFSR with no additional variables is considered first. If the LFSR-based test generator cannot encode all deterministic test pairs, the disclosure considers the second primitive polynomial with the same degree. This process continues until all primitive polynomials have been considered. If the LFSR still cannot encode all tests, it is considered the case when a single additional variable is injected. If all deterministic test pairs still cannot be encoded, the method considers the case when two additional variables are injected. This process continues until the given number of additional variables $L_2$ have been considered ($L_2$ is set to 4 for the experiments). If the LFSR-based test generator still cannot encode all deterministic test pairs, it is considered the primitive polynomials of degree i+1.

Similarly, if all other primitive polynomials of degree i+1 have been checked, and the method still cannot find a proper primitive polynomial, it is checked each of the i+1-degree primitive polynomials with at least one additional variables injected. This process continues until it is found a primitive polynomial with the minimum number of additional variables injected into the LFSR that can encode all deterministic test pairs. Otherwise, the degree of the primitive polynomials has been greater than a given threshold; return no primitive polynomial can be selected.

The procedure for primitive polynomial selection and determination of the number of additional variables are presented to establish the LFSR and the number of additional variables inserted into the LFSR. The detailed scheme to select a primitive polynomial and the number of additional variables injected into the LFSR is presented as follows. The method starts with degree 20 primitive polynomials. First, the number of additional variables v is set to zero. The method checks whether any of the polynomial encodes all deterministic test pairs. If not, the disclosure checks the next i-degree primitive polynomial. This process continues until all primitive polynomials have been checked.

The disclosure checks whether a primitive polynomial with v additional variables injected works when v is set to 1. This process continues until the number of additional variables has been greater than a given threshold. If there is still no primitive polynomial selected, this disclosure considers 21 degree primitive polynomials. This process continues until a primitive polynomial and the minimum number of additional variables, that encode all deterministic test pairs, have been selected.

A well-designed LFSR is needed in order to encode all deterministic pairs. A procedure is proposed to select a primitive polynomial with the minimum degree that can encode all deterministic test pairs for the hard faults. An efficient scheme is used to generate primitive polynomials of any desired degree. For any i≤30, assume that all primitive polynomials are kept in the $Q_i$. As for i>30, only a limited number of primitive polynomials are provided in $Q_i$. The following procedure returns a primitive polynomial with the minimum degree that encodes all deterministic pairs.

Usually, the numbers of care bits of all deterministic test pairs are quite different. Therefore, it is recommended to use an LFSR, whose size is more than the maximum number of care bits $S_{max}$ of all deterministic test pairs. The procedure selects a primitive polynomial of relatively low degree when some additional variables are injected into the LFSR. The commercial tool EDT used similar technique to reduce the amount of test data stored in the on-chip ROM or ATE.

The fanout factor of the demultiplexers can have significant impact on the test data compression rate. Experimental results presented in the rest of the disclosure confirm this. Therefore, it is set the fanout factor of the demultiplexers a larger number for the deterministic test compression.

The proposed DFT architecture as shown in FIG. 1 has an implicit advantage over other BIST architectures. Each stage of the PS drives the input of demultiplexer, each of whose outputs drives a scan tree instead of a single scan chain. Each stage of the PS requires a few number of XOR gates. In any case, flip-flops of all disabled scan chains are assigned with specified values. Therefore, no unknown signals are produced to corrupt the compacted test responses kept in the MISR.

The proposed low-power test compression technique for LOC delay testing is different from the one in. First, the DFT architecture as presented in FIG. 1 is quite different from the one in. The low-power test application scheme is also different from the one in. Each test cycle contains a number of shift cycles followed by a launch cycle and a capture cycle. The number of shift cycles in a test cycle is equal to the maximum depth of scan trees.

Figure 8:
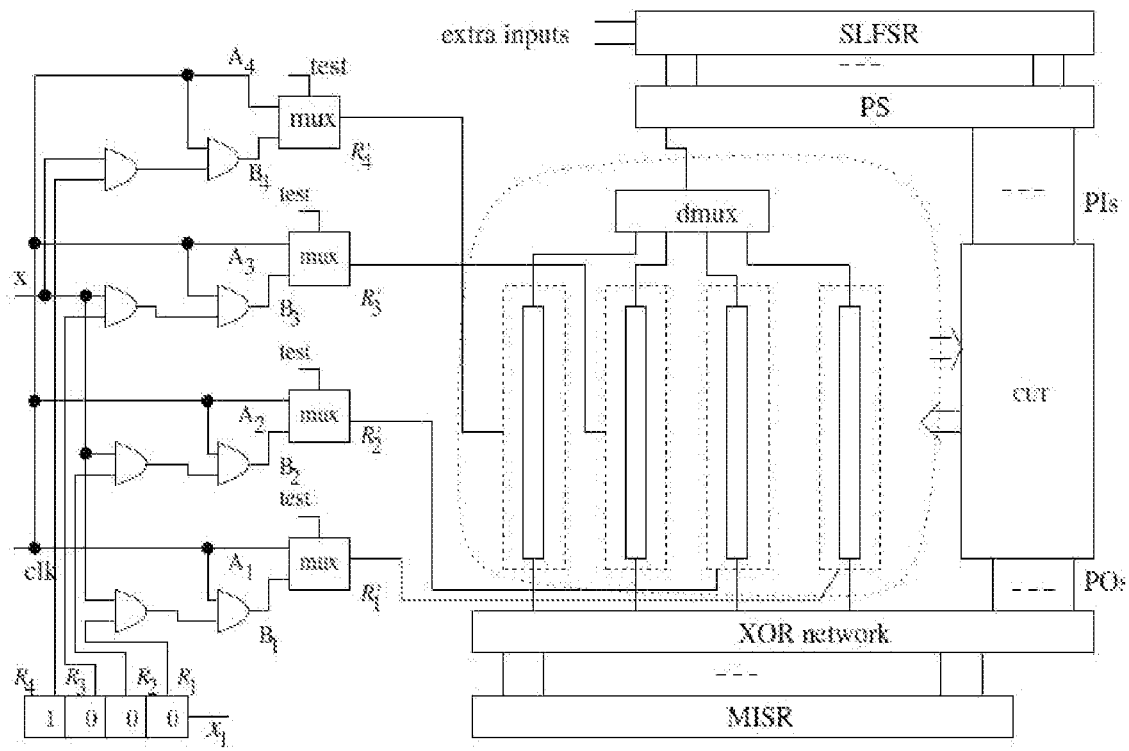
FIG. 8 is a diagram of the DFT architecture to implement low-power test compression for LOC delay testing.

The proposed DFT architecture as shown in FIG. 1, the gating technique and the low-power test application scheme can be of help to improve encoding capability. Experimental results confirm this. The amount of test data to be stored on-chip (or in the automatic test equipment, ATE) is also apparently reduced The DFT architecture can also be used for scan chain designed circuits instead of scan tree designed one when the scan trees cannot be established or designers who do not want to use scan trees. It is considered circuit s953 as an example. As shown in FIG. 8, only a single scan-in pin is used, and the fanout factor of the demultiplexer is set to 4. The method obtains:

The Software-Defined Linear Feedback Shift-Register SLFSR

The software-defined linear feedback shift-register (SLFSR) as shown in FIG. 1 is designed as a configurable n stage LFSR. It can be configured to any LFSR with no more than n stages, which is connected by any primitive polynomial with no more than n degree.

Figure 3:
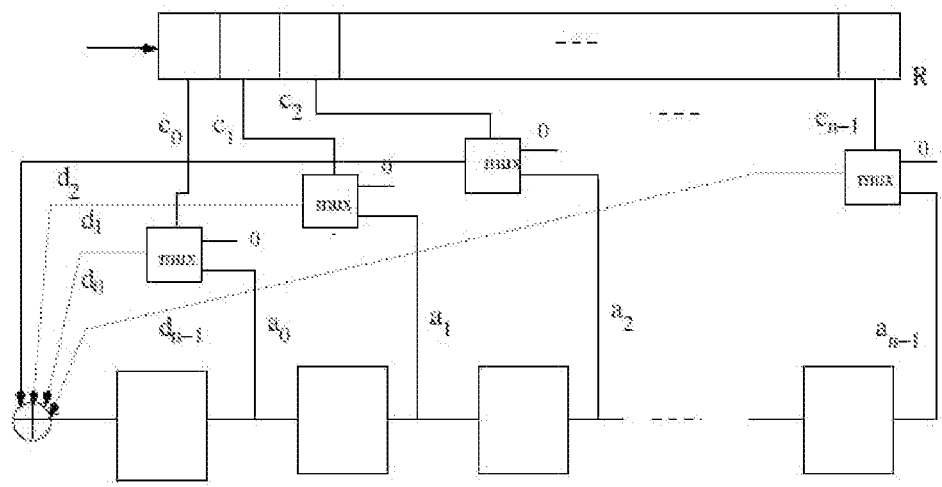
FIG. 3 is a diagram of the proposed software-defined linear feedback shift register (SLFSR)

The SLFSR as shown in FIG. 3 consists of n D flip-flops, an extra n-bit register, and each of the D flip-flops is connected to the 2-input multiplexer whose another input is constant 0. The selection signal of the 2-input multiplexer is connected to the corresponding bit of the extra register. The output of the multiplexer selects the output of the corresponding D flip-flop when the selection signal is set to value 1; otherwise, it selects constant 0.

According to the selected primitive polynomial, the control vector is generated for the SLFSR. That is, determine each bit of the control vector as follows: set the bit to value 1 if the stage in the selected primitive polynomial is non-zero, otherwise, it is set to 0. Load the control vector to the extra register of the SLFSR.

Figure 4:
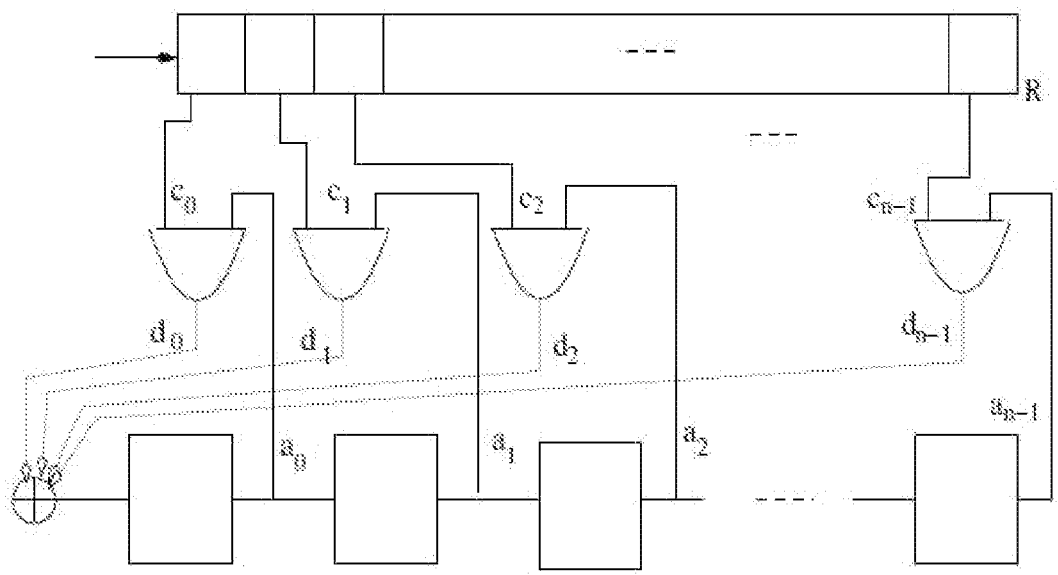
FIG. 4 is a diagram of the simplified SLFSR.

The simplified version as shown in FIG. 4 of the software defined linear feedback shift register (SLFSR) as stated in FIG. 3 is presented as follows: each multiplexer is replaced by a 2-input AND gate, one input is connected to the output of the corresponding D flip-flop, the other input is directly connected the corresponding bit of the extra register.

The control vector, loaded into the extra register, defines the primitive polynomial to establish the selected LFSR. Determine each bit of the control vector as follows: set the bit to value 1 if the stage in the selected primitive polynomial is non-zero, otherwise, it is set to 0.

Figure 6:
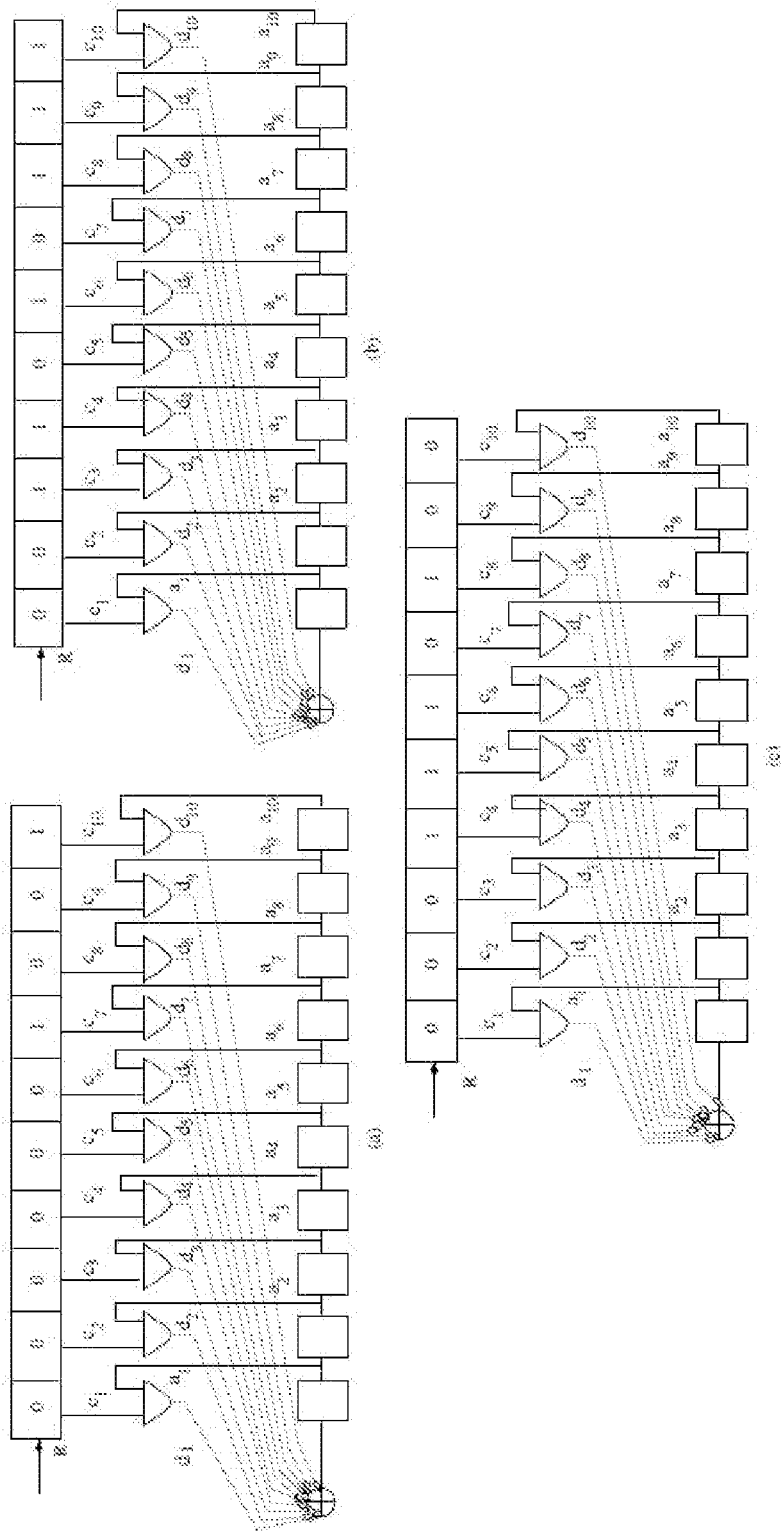
FIG. 6 is a diagram of different implementations of the SLFSR: (a) $x^{10}+x^7+1$, (b) $x^{10}+x^9+x^8+x^6+x^4+x^3+1$; and (c) $x^8+x^6+x^5+x^4+1$.
Figure 7:
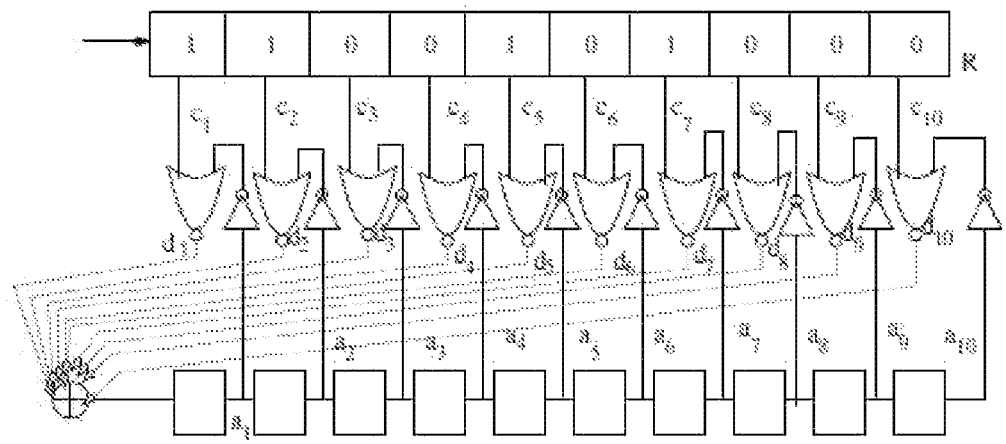
FIG. 7 is a diagram of SLFSR with $X^{10}+x^9+x^8+x^6+x^4+x^3+1$ by the alternative implementation.

As shown in FIG. 6, the 10-stage SLFSR can implement different LFSRs when different control vectors are delivered into the extra register. As shown in FIG. 6(a), the SLFSR implements the LFSR with $x^{10}+x^7+1$ when the control vector is set to 0000001001. As given in FIG.~6(b), the SLFSR implements the LFSR with primitive polynomial $x^{10}+x^9+x^8+x^6+x^4+x^3+1$. When the control vector 0001110100 is loaded, the LFSR with primitive polynomial $x^8+x^6+x^5+x^4+1$ is provided as shown in FIG. 6(c).

Figure 5:
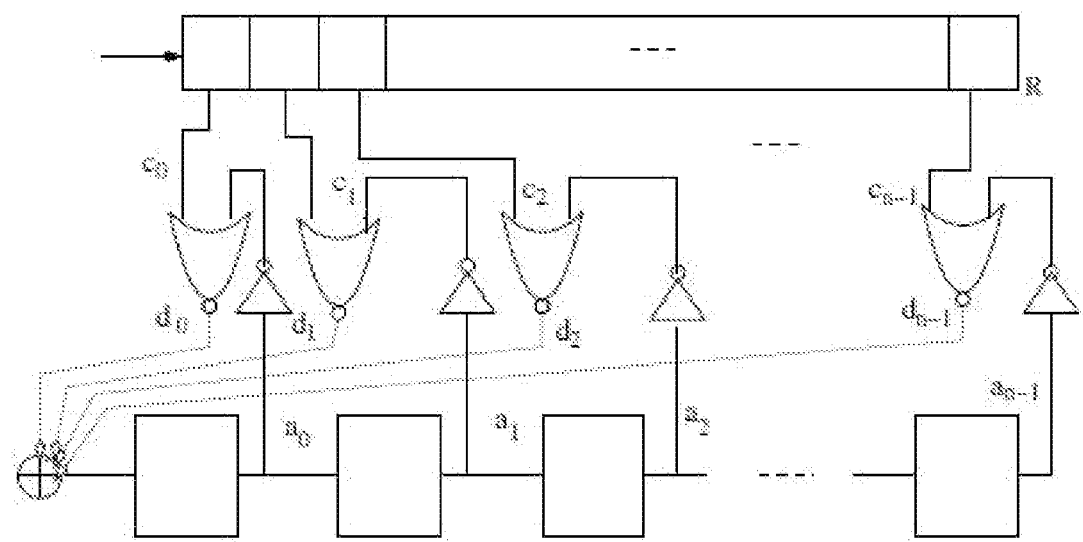
FIG. 5 is a diagram of an alternative SLFSR.

The software-defined linear feedback shift register as shown in FIGS. 3 and 4 can be replaced by the following alternative SLFSR architecture as shown in FIG. 5: each 2-input AND gate is replaced by a 2-input NOR gate, the output of each D flip-flop is connected to an inverter, and the output of the inverter is connected to the 2-input NOR gate. The other input of the 2-input NOR gate is connected the corresponding bit of the extra register.

The control vector is determined as follows: set the bit to value 0 if the stage in the selected primitive polynomial is non-zero, otherwise, it is set to 1. The SLFSR as stated in FIGS. 3-5 can also be applied to ring generator or folded counter for test data compression.

The SLFSR as stated above can also be applied to test compression for single stuck-at tests; only the scan forest and the test response compactor are revised according to the single frame circuit.

Low-Power Test Compression for LOC Delay Testing

The method loads a seed to the LFSR for deterministic built-in self-test. As shown in FIG. 1, the demultiplexers and gating logic are used not only for power consumption reduction, but also for encoding capability improvement. The fanout factor of the demultiplexers (dmux) for all scan-in pins are set to the same value. The parameter dmux is equal to k. It is shown that it has impact on encoding capability of the LFSR. The test application cost does not increase when the parameter dmux increases. The maximum depth of scan trees is also reduced simultaneously when dmux increases.

Each output of a demultiplexer drives a scan-tree instead of a scan chain. As shown in FIG. 1, there are k clock signals. Each of the clock signals drives a scan tree that fans out from each demultiplexer. For example, the clock signal $R_1'$ drives all the first scan trees loaded by all scan-in pins, while the clock signal $R_k'$ drives the kth scan trees.

There is no fault coverage loss introduced by the gating technique because the same test pair is applied to the whole circuit. Therefore, the dmux parameter can be set large enough. The parameter has impact on test power reduction. However, this parameter can be set large for the low-power test compression scheme, which has impact on the test data compression ratio. The same set of values for the additional variables is injected into the LFSR for each subset of scan trees driven by the same clock signal. Therefore, the compressed test data for each test pair is equal to the summation of the total number of injected additional variables (e d', d'≤d, d is the maximum depth of the scan trees) and the size of the LFSR.

A seed is loaded into the LFSR for the first subset of scan trees. The test data are loaded to the first subset of scan trees when the additional variables are injected into the LFSR. After the test data have been delivered into the first subset of scan trees, the test data based on the successive state of the LFSR are loaded into the second subset of scan trees when the same values on the additional variables are injected to the LFSR. This process continues until all scan trees are loaded the test data.

Each pin from the gating logic drives a group of scan trees that will be activated simultaneously. An effective seed encoding scheme is used here to reduce the storage requirements of the deterministic test pairs for LOC transition fault testing. The encoded seed is shifted into the LFSR first. A deterministic test pair is shifted into the scan trees that are activated by the gating logic, where each scan-in signal drives a number of scan trees, and only one of the scan trees driven by the scan-in signal is activated. The additional variables are injected into the LFSR when the seed is shifted into the activated scan trees. The gating logic as shown in FIG. 1 partitions scan trees into multiple groups.

The first group of scan trees is disabled after they have received the test data. The second group of scan trees is activated simultaneously, and all other scan trees are disabled. The following scan shift cycles start from the LFSR state when all deterministic test data are shifted into the first group of scan trees. The scan shift operations are repeated when the same additional variables are injected into the LFSR. This process continues until all scan trees have received their test data.

The method activates all scan flip-flops in the launch cycle when applying the test data to the primary inputs (PIs). A capture cycle for all scan flip-flops follows when the test data are applied to the PIs. The technique can only reduce shift power instead of test power in the launch and capture cycles. Test power in the launch and capture cycles can be reduced by using a low-power test generator, which is not discussed in this disclosure.

The scan outputs of all scan chains, that are driven by the same clock signal, are connected to the same XOR network to compact test responses during the low-power test application phase. As shown in FIG. 1, the output of all shorter scan chains are connected to the XOR network, and the outputs of the XOR network are connected to the MISR. The test responses of the previous test pair captured in the scan flip-flops are shifted out in only a few clock cycles when shifting in the next test pair.

It is first considered the situation when dmux=1. That is, no gating technique is used. Let L, i, v, and S be the size of the LFSR, the number of consecutive cycles to inject the additional variables, the number of additional variables, and the number of care bits, respectively. Assume that the number of care bits for all scan chains at level k is $b_k$, and the total number of injected additional variables after j shift cycles is $V_j$. The necessary conditions to encode all deterministic test pairs can be stated as follows: (a) L+i·v≥S, and (b) $\Sigma_{k=d-1}^{k-d-1-j} b_k \leq (L+V_j)$.

The summation of the size of the LFSR and the total number of additional variables injected into the LFSR must be at least the maximum number of care bits of the deterministic test pairs. Therefore, the condition L+i·v≥S must be satisfied. At any clock cycle, the summation of the size of LFSR and the whole 6 number of injected additional variables must be greater than the total care bits in the scan flip-flops that have been shifted test data in the process of test application. The condition $\Sigma_{k=d-1}^{k-d-1-j} b_k \leq (L+V_j)$ must be satisfied in order for the linear equations to be solvable.

Let us consider the situation when dmux>1. That is, the gating logic as shown in FIG. 1 is used. Assume that the number of care bits for all scan flip-flops at level k is $b_{j,k}$ for the jth subset of scan chains, and the total number of injected additional variables after j shift cycles is $V_{j,i}$ for the jth subset of scan chains.

The necessary conditions to encode the care bits in the first group of scan chains for all deterministic test pairs can be stated as follows: (a) L+h·v≥S (v additional variables are injected into the LFSR for the first h clock cycles), and (b) $\Sigma_{k=d-1}^{k-d-1-j} b_{j,k} \leq (L+V_j)$.

The necessary conditions to encode the care bits after the first group of scan chains for all deterministic test pairs can be stated as follows: (a) L+h·v≥S and (b) $\Sigma_{k=d-1}^{k-d-1-j} b_{j,k} \leq (L+V_j)$, where v·h is the total number of additional variables injected into the LFSR, and additional variables are injected into the LFSR in the first h clock cycles. At any clock cycle, the summation of the size of LFSR and the total number of injected additional variables must be greater than the total care bits in the scan flip-flops that have received test data in the process of test application.

When dmux (the fanout factor of the demultiplexers), as shown in FIG. 1, increases, the test application time does not increase. The reason is that depth of the scan trees also decreases when dmux increases. However, test data volume can be compressed better when dmux increases. The experimental results presented later confirm this.

Why test data can be compressed better when dmux increases? The reason can be as follows: (1) it can be easier to find solution for the linear equations when partitioning the scan trees into more subsets. The number of equations to be satisfied can be fewer before enough additional variables have been inserted. Therefore, the number of extra pins, that must be injected into the LFSR, can be fewer. (2) The total number of additional variables can be fewer if the number of injected extra pins to the LFSR remains the same because depth of scan trees decreases.

Test data volume corresponding to a test pair includes two portions: (1) the seed, and (2) the total number of additional variables. In this disclosure, the total number of additional variables T is T=v·h, where v and h are the number of extra pins injected into the LFSR and number of cycles with v additional variables injected into the LFSR.

The method provides zero-aliasing test response compaction. All scan output signals of the scan chains driven by the same clock signal are connected to the same XOR tree. Two scan chains $(c_{1,1}, c_{1,2}, \ldots c_{1,i})$ and $(c_{2,1}, c_{2,2}, \ldots c_{2,i})$ are compatible if $c_{1,1}$ and $c_{2,1}$, $c_{2,1}$ and $c_{2,2}$, $\ldots$, $c_{1,i}$ and $c_{2,i}$ do not have any common combinational predecessor in the two-frame circuit, respectively. The scan forest architecture and the proposed DFT architecture make the scan chain much shorter, which improve the performance of the test response compactor.

The outputs of the XOR network are connected to the MISR. Test responses of all deterministic test pairs and pseudo-random patterns can be compacted into a couple of bits. Unknown-tolerant techniques can be proposed to mask unknown responses if necessary.

Static Test Compaction by Bitwise Modifying the Tests

A static test compaction procedure, after all tests have been produced, is proposed by bitwise modifying the care bits of the pattern. The test patterns are ordered according to the number of care bits. It is considered the compact test set for LOC transition fault testing after dynamic and static test compaction have been completed. Each test pair t keeps a fault list Ft covered by the test pair.

A pattern with the most care bits is taken first, the method do fault simulation on the modified seed on each bit of the seed and the additional variables by complementing the bit. Fault simulation is performed on a small subset of faults to reduce CPU time fault simulation. The subset of faults contains only faults on the influenced region by the changed bit of the test pair.

The method uses a selective tracing scheme to find the influenced region of the change bit from the changed bit on the test pair on the two-frame circuit model. The process continues until a gate with any other input I assigned a controlling value or the output of the gate is don't care, where I is not in the influenced region of the change bit.

The method remains the modification on the test t if the modified test covers all detected faults in $F_t$, and detect at least one more fault covered by any test later in the ordered test sequence. Otherwise, the method recovers the test back to the original. When complementing a bit of the test makes the test pair detect any fault f covered by another test pair t' later in the ordered sequence, the fault f is moved to the detected fault list $F_t$ of test t. This fault is also removed from the detected fault list $F_{t'}$ of test t'. When the detected fault list $F_{t'}$ of t' becomes empty, t' is deleted from the test set.

Experimental Results

TABLE II

Performance of the proposed test compression scheme for test sets of LOC transition fault testing

| circuit | previous method ||||||| Dcompress ||
| --- | --- | --- | --- | --- | --- | --- | --- | --- | --- |
| | FC | vec | Org. | MAX | CTD(bit) | CPU(s) | faults | FC | vec |
| s38417 | 99.68 | 179 | 302868 | 681 | 90243 | 2068 | 47493 | 99.69 | 220 |
| b19 | 84.47 | 9820 | 65695800 | 4053 | 4770829 | 11246 | 510382 | 84.48 | 10897 |
| wb_conmax | 99.05 | 1250 | 3785000 | 466 | 496591 | 1872 | 225226 | 99.05 | 1610 |
| usb_funct | 98.51 | 480 | 894720 | 683 | 127239 | 2136 | 67958 | 98.52 | 890 |
| pci_bridge | 97.65 | 862 | 3171298 | 1004 | 307992 | 4028 | 136249 | 97.67 | 1002 |
| des_perf | 99.88 | 248 | 2284576 | 4878 | 1370773 | 6856 | 452598 | 99.89 | 432 |
| ethernet | 99.39 | 3710 | 39852820 | 2159 | 3499300 | 7616 | 456836 | 99.39 | 3720 |
| vga_lcd | 99.64 | 8142 | 14073296 | 6032 | 9143327 | 14110 | 740895 | 99.65 | 8910 |
| netcard | 97.52 | 27810 | 2720541060 | 9609 | 137019952 | 35220 | 2905064 | 97.67 | 29670 |

| circuit | Dcompress |||||||
| --- | --- | --- | --- | --- | --- | --- | --- |
| | Org. | MAX | CTD(bit) | CR(times) | CPU(s) | dmux | faults | SI |
| s38417 | 63737 | 100 | 12599 | 23.64 | 1961 | 2 | 47070 | 10 |
| b19 | 24649014 | 1472 | 1420508 | 46.30 | 10106 | 4 | 507842 | 20 |
| wb_conmax | 3812480 | 71 | 68958 | 54.89 | 1643 | 2 | 223554 | 10 |
| usb_funct | 395668 | 100 | 17730 | 50.46 | 1904 | 2 | 67397 | 20 |
| pci_bridge | 694608 | 118 | 33302 | 95.23 | 3625 | 2 | 135424 | 20 |
| des_perf | 238353 | 49 | 13142 | 173.84 | 6029 | 2 | 448459 | 10 |
| ethernet | 39960240 | 2138 | 2785870 | 14.31 | 7489 | 32 | 455923 | 30 |
| vga_lcd | 10501745 | 364 | 454385 | 307.36 | 14057 | 8 | 737880 | 20 |
| netcard | 145970466 | 494 | 5419312 | 502.01 | 34897 | 32 | 2887738 | 30 |

Table II shows the performance of the proposed low-power test compression scheme, called Dcompress. The column "previous method" presents the performance the test compression for the most widely used commercial test compression tool. The columns FC, vec, MAX and CDT(bit) show the fault coverage, the number of test pairs, the maximum care bit of the test set, and the number of bits for the compressed test data to encode all deterministic test pairs, respectively. Columns CPU(s), faults, and Org. show the CPU time (seconds) to generate the compact test pair set, the number of transition faults, and the original test data volume (bits), respectively. The column Org. in Table II presents the baseline test data volume produced by the compact test generator.

It is found from the experimental results in Table II that the maximum care bits for scan forest design circuits is far less than that of the scan chain designed circuits. That is, the scan forest can compress test data significantly. The maximum care bit reduction time is closely related to the group size of the scan forest for all circuits. Both the scan-chain based and scan forest based methods use the same number of scan-in pins. The column dmux presents the fanout factor of the demultiplexers for the method. The number of test pairs increases slightly for all circuits using the method because it uses the scan forest architecture. The maximum care bit number is significantly reduced compared to the previous method, which also makes the test data volume of compressed tests significantly reduced.

TABLE III

Performance of the proposed static test compaction scheme

| circuit | Dcompress |||||  Static Compaction |||||||||
| --- | --- | --- | --- | --- | --- | --- | --- | --- | --- | --- | --- | --- | --- | --- |
| | FC | vec | MAX | CTD(bit) | CPU(s) | FC | vec | rate1(%) | MAX | CTD(bit) | rate(%) | CPU(s) | CR(times) | dmux | SI |
| s38417 | 99.69 | 220 | 100 | 12599 | 1961 | 99.69 | 186 | 15.45 | 100 | 11573 | 8.14 | 936 | 26.17 | 2 | 10 |
| b19 | 84.48 | 10897 | 1472 | 1420508 | 10106 | 84.48 | 10024 | 8.01 | 1472 | 1290026 | 9.19 | 2792 | 50.93 | 4 | 20 |
| wb_conmax | 99.05 | 1610 | 71 | 68958 | 1643 | 99.26 | 1483 | 7.89 | 71 | 60747 | 7.90 | 628 | 62.31 | 2 | 10 |
| usb_funct | 98.52 | 890 | 100 | 17730 | 1904 | 98.64 | 828 | 6.97 | 100 | 16447 | 7.24 | 664 | 54.40 | 2 | 20 |
| pci_bridge | 97.67 | 1002 | 118 | 33302 | 3625 | 97.86 | 926 | 7.58 | 118 | 30704 | 7.80 | 982 | 103.29 | 2 | 20 |
| des_perf | 99.89 | 432 | 49 | 13142 | 6029 | 99.89 | 406 | 6.02 | 49 | 12343 | 6.08 | 1712 | 185.09 | 2 | 10 |
| ethernet | 99.39 | 3720 | 2138 | 2785870 | 7489 | 99.58 | 3350 | 9.95 | 2138 | 2517283 | 9.64 | 2546 | 15.83 | 32 | 30 |
| vga_lcd | 99.65 | 8910 | 364 | 454385 | 14057 | 99.64 | 8019 | 10.0 | 364 | 418234 | 7.96 | 4896 | 335.87 | 8 | 20 |
| netcard | 97.52 | 29670 | 494 | 5419312 | 34897 | 97.50 | 26851 | 9.50 | 494 | 4909896 | 9.40 | 10832 | 554.09 | 32 | 30 |

Table III presents the performance comparison of the proposed static test compaction scheme. The columns vec, MAX, CTD(bit), rate1, rate, CPU(s), and CR(times) stand for the pattern count, the maximum number of care bits for the reduced seeds, the total number of test data bits, reduction percentage for the pattern count, reduction percentage for test data volume, CPU time (seconds) for the static test compaction scheme, and the updated compression ratio (times). The number of maximum care bits remains the same for all circuits. Test data volume is reduced close to 10% for a couple of circuits. The pattern count also decreases apparently for almost all circuits. The static test compaction scheme obtains apparently better compression ratio for all other circuits after combined with the proposed low-power test compression scheme.

The invention claimed is:

1. A design for testability (DFT) architecture configured to implement a low-power test compression for launch-off-capture (LOC) transition fault testing by a deterministic built-in self-test (BIST) and a software-defined linear feedback shift register (SLFSR), the DFT architecture comprising:

a SLFSR established by a selected primitive polynomial and a selected number of extra variables injected to the SLFSR, and an extra register with a loaded control vector for primitive polynomial;

scan trees for LOC transition fault testing and included in a scan forest; and a gating logic, wherein the SLFSR is designed as a configurable n stage LFSR with no more than n stages, which are connected by any primitive polynomial with no more than n degree;

wherein the SLFSR comprises n D flip-flops, an extra n-bit register, each of the D flip-flops connected to a 2-input multiplexer having another input at constant 0, a selection signal of the 2-input multiplexer connected to a corresponding bit of the extra n-bit register, the output of the 2-input multiplexer selecting the output of the corresponding D flip-flop when the selection signal is set to value 1, otherwise, the 2-input multiplexer selects constant 0;

wherein all DFT logics are inserted before automatic test pattern generation (ATPG), the DFT logics comprising the SLFSR, a phase shifter (PS) configured to drive demultiplexers, the demultiplexers, a gating logic, and a scan forest for LOC transition fault testing, a XOR network for test response compaction, and an unknown-tolerant MISR, the scan foresting comprising a plurality of scan trees being constructed by circuit structural analysis;

wherein a primitive polynomial with degrees and a certain number of extra variables, which encodes all deterministic tests are selected; each output of each demultiplexer drives a scan tree, where all scan flip-flops at a scan tree do not have any common combinational successor in a two-frame circuit;

wherein more scan chains are connected to a same XOR network to compact test responses if the scan flip-flops at a same level of the scan chains do not have any common predecessor in the two-frame circuit;

wherein each demultiplexer drives scan trees, where each scan tree is driven by a separate clock signal;

wherein a signal R'1 drives all first scan trees from all demultiplexers, a signal R'2 drives all second scan trees from all demultiplexers, . . . , and R'k drives all kth scan trees from all demultiplexers;

wherein increasing fanout factors of the demultiplexers does not increase test application cost because a depth of the scan trees decreases; and wherein each stage of the PS drives multiple scan trees, each stage of the PS in multiple scan-chain design drives a single scan chain;

wherein if a fanout factor of the demultiplexers is 16, and a group size for the scan trees is 10, each scan-in pin drives 160 scan chains; and wherein a compactor connected to a combinational part CUT of the circuit is configured to reduce a size of the MISR.

2. The DFT architecture of claim 1, wherein the low-power test compression comprises:

inserting a low-power scan architecture, a decompressor/compactor, and SLFSR into a circuit;

conducting compact ATPG to generate LOC at-speed scan tests for transition delay faults;

selecting a primitive polynomial to encode all generated tests;

loading a control vector to implement the SLFSR; and applying generated seeds in a low-power test application mode, while each has a sequence of extra variables;

wherein after the SLFSR, the phase shifter, the scan forest for LOC transition fault testing, the gating logic, and the unknown-tolerant test response compactor are inserted into a circuit, the ATPG tool runs to generate the compact test set for all transition faults;

wherein the primitive polynomial with degrees and extra variables injected into the SLFSR, which encodes all test pairs are selected;

wherein a control vector is produced and loaded into the extra n-bit register to establish the SLFSR with the selected primitive polynomial;

wherein each test seed, with the injected extra variables, is applied to the circuit in the low-power test mode; and wherein the above processes are continued until all test seeds have been applied.

3. The DFT architecture of claim 1, wherein the SLFSR comprises n D flip-flops and an extra n-bit register, each of the D flip-flops is connected to a 2-input AND gate, one input of the 2-input AND gate is connected to the output of a corresponding D flip-flop and the other input of the 2-input AND gate is directly connected a corresponding bit of the extra n-bit register.

4. The DFT architecture of claim 1, wherein the SLFSR comprises n D flip-flops and an extra n-bit register, each of the D flip-flops is connected to a 2-input NOR gate, the output of each D flip-flop is connected to an inverter, and the output of the inverter is connected to the 2-input NOR gate, the other input of the 2-input NOR gate is connected a corresponding bit of the extra n-bit register; and wherein a control vector is determined by setting the bit to value 0 if the stage in a selected primitive polynomial is non-zero, otherwise, the bit is set to 1.

* * * * *